(12) United States Patent
Soejima et al.

(10) Patent No.: US 6,307,392 B1
(45) Date of Patent: Oct. 23, 2001

(54) PROBE CARD AND METHOD OF FORMING A PROBE CARD

(75) Inventors: Koji Soejima; Naoji Senba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/181,618

(22) Filed: Oct. 28, 1998

(30) Foreign Application Priority Data

Oct. 28, 1997 (JP) .................................... 9-295361

(51) Int. Cl.[7] ....................................................... G01R 1/06
(52) U.S. Cl. .......................... 324/762; 324/754; 438/461; 438/611; 257/735
(58) Field of Search ........................... 324/754, 762; 438/17, 18, 106, 110, 118, 121, 123, 461, 462, 611, 612, 613; 257/735, 737, 738, 777, 778, 779

(56) References Cited

U.S. PATENT DOCUMENTS

| | | | |
|---|---|---|---|
| 5,475,318 | * | 12/1995 | Marcus et al. ........................ 324/762 |
| 5,625,298 | * | 4/1997 | Hirano et al. ......................... 324/754 |
| 5,811,982 | * | 9/1998 | Beaman et al. ....................... 324/762 |
| 5,828,226 | * | 10/1998 | Higgins et al. ........................ 324/762 |
| 5,852,871 | * | 12/1998 | Khandros ........................... 324/754 X |
| 5,914,614 | * | 6/1999 | Beaman et al. ....................... 324/754 |
| 5,998,228 | * | 12/1999 | Eldridge et al. ........................ 438/15 |
| 6,014,032 | * | 1/2000 | Maddix et al. ....................... 324/762 |

FOREIGN PATENT DOCUMENTS

| | | |
|---|---|---|
| 51-148358 | 12/1976 | (JP) . |
| 1-98238 | 4/1989 | (JP) . |
| 2-221881 | 9/1990 | (JP) . |
| 4-78037 | 3/1992 | (JP) . |
| 5-29406 | 2/1993 | (JP) . |
| 5-231815 | 9/1993 | (JP) . |
| 5-251523 | 9/1993 | (JP) . |
| 5-299015 | 11/1993 | (JP) . |
| 6-102318 | 4/1994 | (JP) . |
| 6-163549 | 6/1994 | (JP) . |
| 6-187905 | 7/1994 | (JP) . |
| 6-230030 | 8/1994 | (JP) . |
| 7-63548 | 3/1995 | (JP) . |
| 7-167912 | 7/1995 | (JP) . |
| 7-311206 | 11/1995 | (JP) . |
| 8-15283 | 1/1996 | (JP) . |
| 8-15284 | 1/1996 | (JP) . |
| 8-50146 | 2/1996 | (JP) . |
| 8-189931 | 7/1996 | (JP) . |
| 8-220140 | 8/1996 | (JP) . |
| 9-199552 | 7/1997 | (JP) . |

* cited by examiner

*Primary Examiner*—Glenn W. Brown
(74) *Attorney, Agent, or Firm*—Young & Thompson

(57) ABSTRACT

One main surface of a substrate has formed on it an appropriate contact terminal having in one part thereof a protruding part. An end of a lead is mounted via a holding part that is provided between the substrate and a probe, the lead being disposed along the main surface of the substrate so as to peel away from the main surface.

32 Claims, 10 Drawing Sheets

PRIOR ART

1 ··· SEMICONDUCTOR ELEMENT
2 ··· Al ELECTRODE
3 ··· Au BUMP
4 ··· MOUNTING SUBSTRATE
211 ··· SOLDER COAT
212 ··· RESIN COAT

5 ··· Ti FILM
6 ··· Pt FILM

PRIOR ART

PROBE CARD AND METHOD OF FORMING A PROBE CARD

BACKGROUND OF THE INVENTION

1. Field of the Invention

The present invention relates to a probe card that is connected to electrodes or terminals of an electronic component for inspection of the electrical conductivity condition of the electronic component, and more specifically to a probe card that is connected to electrodes or terminals of an electronic component which includes semiconductor devices such as ICs which are mounted with high density for inspection of the conductivity condition or electrical characteristic of the electronic component.

2. Description of Related Art

In the past, the above-noted type of probe or probe card, as indicated for example in Japanese Unexamined Patent Application publication H8-50146, were used to achieve connections to ICs and the like in order to perform an inspection thereof.

As shown in FIG. 16, this was fabricated by performing etching of a substrate to form a cantilever beam, polysilicon on the top of this cantilever beam being subjected to anisotropic etching to form a pointed tip thereon, metal being then forming onto the surface thereof to form a probe.

In the past, there was a known method of forming a structure for connection with an electrode, using the transfer method, as indicated, for example, in the Japanese Unexamined Patent Publication (KOKAI) No. 1-98238.

Specifically, as shown in FIG. 18, a titanium film 5 and a platinum film 6 are formed on a bump-forming substrate 4, a resist film 7 being coating thereover, after which plating is done to form a gold bump 3 on the substrate.

Then, as shown in FIG. 17, after removing the above-noted resist film 7, the gold bumps of the bump-formation substrate are positioned with respect to the aluminum electrodes 2 of the semiconductor element 1, the gold-bump 3 being transferred by means of hot pressing.

Additionally, there is a known inspection apparatus, as indicated in the Japanese Unexamined Patent Publication (KOKAI) No. 7-167912, which uses an anisotropic film for the purpose of achieving an electrical connection with respect to the electrode of an IC or the like.

In this inspection apparatus, a hole is formed in an organic resin film, and this hole is then filled with a metal, so as to form a bump which makes connection to an electrode or a terminal or the like of an electronic component to be inspected.

The first problem with the above-described prior art is that, in order to fabricate a probe card as indicated, for example, in the Japanese Unexamined Patent Publication (KOKAI) No. 8-50146, it is necessary to use a substrate having a specific structure, thereby preventing the use of a printed circuit substrate of a type that is widely used.

The reason for this is that, in order to achieve flexibility in the probe, it is necessary to fabricate a depression in a specific location of the substrate.

That is, because a printed circuit substrate of the type that is generally used does not permit the formation of such a depression, the probe card as indicated in the Japanese Unexamined Patent Publication (KOKAI) No. 8-50146 is limited to the case in which the substrate material is silicon.

The second problem with the prior art is that, with the method of forming a bump as indicated in the Japanese Unexamined Patent Publication (KOKAI) No. 1-98238, the height of the bump is small.

The reason for this is that when the pitch between the formed bumps becomes small, it becomes difficult to form resist. That is, in order to make the bump formation pitch small and achieve a large height, it is necessary to form a resist film having a height corresponding to the height of the bump, so as to form an aperture part that forms the bump.

However, when the resist film thickness becomes great, it is difficult to control the shape of the aperture part.

A third problem involved with prior art is that, in the method of forming a bump as indicated in the Japanese Unexamined Patent Publication (KOKAI) No. 1-98238, it is not possible to form a bump with a pointed tip for use as a probe contact point.

The reason for this is that in forming a bump by the method indicated in the Japanese Unexamined Patent Publication (KOKAI) No. 1-98238, because the bump is formed on a flat substrate, the tip of the transferred bump is flat.

A fourth problem with the prior art is that, in the method of forming a bump as indicated in the Japanese Unexamined Patent Publication (KOKAI) No. 8-50146, it is not possible to form a bump on an arbitrary electrode.

The reason for this is that, when single crystal silicon is formed over the surface onto which an electrode is to be formed, if the electrode surface has poor flatness, it is difficult to apply single crystal silicon over all the electrodes.

An additional reason is the damage to the surface of the substrate onto which a bump is to be performed when performing etching of silicon or an $SiO_2$ film.

A fifth problem with the prior art is that of high cost, in the case of the method of forming a bump that is indicated in the Japanese Unexamined Patent Publication (KOKAI) No. 8-50146.

The reason for this is that it is only possible to form a bump one time from silicon to be used for bump formation.

A sixth problem in the prior art is that, in the method of forming a bump indicated in the Japanese Unexamined Patent Publication (KOKAI) No. 8-50146, it is difficult to fabricate probes for the testing of LSI devices or other ICs which have electrodes disposed in a matrix arrangement.

The reason for this is that the spacing between electrodes of an IC having electrodes which are disposed in a matrix arrangement is approximately 250 $\mu$m, so that for an IC measuring 10 mm by 10 mm, there would be more than 1000 electrodes, and for an IC measuring 15 mm by 15 mm, there would be more than 3000 electrodes.

To give access to this number of electrodes in two dimensions requires wiring of a density of 50 lines per millimeter.

This corresponds to a wiring pitch of 20 $\mu$m, and even electrodes at the outer periphery of the device, when one considers the existence of electrodes and etched depressions at even the outer periphery of the device, this pitch shrinks even more, making it difficult to achieve wiring access to the outside from a probe.

The seventh problem involved with the prior art is that, with the method of forming a bump indicated in the Japanese Unexamined Patent Publication (KOKAI) No. 1-98238, the number of times a bump-forming substrate is used repeatedly is small.

The reason for this is that, when damage occurs to the platinum film during the manufacturing process, there is no method of repairing the damage.

Accordingly, an object of the present invention is to provide a probe card which improves on the prior art, and enables efficient inspection of the conductivity characteristics or electrical characteristics of electronic components such as ICs, in which a plurality of electronic devices are mounted thereon with high density, and which features a large number of probes that are disposed with high density, each probe having an appropriate degree of flexibility, so that even if the electrodes or connection contacts of the opposing electronic components to be inspected have some degree of deformation or displacement in the up-down direction, a reliable contact is made with each of them, and further to provide a method of manufacturing a probe card with good efficiency and low cost.

SUMMARY OF THE INVENTION

To achieve the above-noted objects, the present invention has the following basic technical constitution.

Specifically, the first aspect of the present invention is a probe card onto a part of a first main surface of which is provided a lead on a part of which a contact terminal being provided and one end part of which is joined to the substrate via a holding part, the lead being disposed along the main surface of the substrate in a condition in which it is peeled away from the main surface. The second aspect of the present invention is a method of forming a probe card comprising steps of, forming onto a lead-formation substrate having a die part for the purpose of forming a contact terminal of a lead section a thin film of a prescribed shape, using a material that makes up the lead substrate, preparing the substrate onto which a prescribed wiring part which will be used in the probe card later on, has been provided, forming a holding section on an edge part of the lead-formation thin film formed on the lead-formation die part substrate and on the edge part of which the contact terminal of the lead-formation thin film, is not disposed, joining together the holding section and the substrate, and causing the substrate to separate away from the lead-formation die substrate, and causing transfer, onto the substrate side, of the lead-formation thin film, including the contact terminal that is formed on the lead-formation die substrate.

By adopting the above-noted technical constitutions, the probe card and method of forming a probe card according to the present invention facilitate the achievement of a probe card onto which are arranged in high density a large number of probes which make contact with the electrodes or contact terminals of an electronic component to be inspected.

Further more, a appropriate degree of protrusion is formed on the part that makes contact with the electrodes or contact terminals that are provided on the electronic component to be inspected, the result being that reliable contact is maintained between the probes and the electrodes or contact terminals that are provided on the electronic component under inspection, and also that one end part of the lead section the is formed as one with and is connected to the protrusion part is either joined to the probe card via a holding section that is provided on one end of the lead section or caused to be joined with a protruding holding section that is provided on one main surface of the probe card, enabling contact with the electrodes or contact terminals by an appropriate degree of pressure by the protruding part.

Additionally, in a probe card according to the present invention, because the above-noted protruding part is configured so that its contact position with respect to the electrodes or contact terminals can be arbitrarily changed, it is possible to achieve a reliable contact, even if the position of surface arrangement of the electrodes or contact terminals of the electronic component under inspection changes or if the surface becomes deformed, by means of an appropriate amount of contact force.

That is, in a probe card according to the present invention, with respect to all of the many electrodes or contact terminals that are provided on an electronic component under inspection, it is possible to simultaneously and accurately make connection.

Therefore, it is possible using the present invention to efficiently perform testing of the conductivity or electrical characteristics, for example, of electronic components such as high-density integrated circuits.

With regard to the method of forming a probe card according to the present invention, because the method adopted is that of preparing a substrate onto which has been formed a plurality of die parts, having a pre-established shape, for the purpose of forming the above-noted protruding parts, plating and lithography operations being utilized to form the above-noted plurality of protrusions as one with the lead section, after which the protrusions and lead section are simultaneously transferred to a main surface of the probe card substrate which forms a printed circuit board, this manufacturing method is simple, and enables the formation of a plurality of protrusions with an arbitrary shape, arbitrary spacing, and arbitrary arrangement density with respect to the leads which are connected thereto, thereby enabling a great reduction in the cost of manufacturing the probe card.

DETAILED DESCRIPTION OF THE PREFERRED EMBODIMENTS

Embodiments of present invention are described below, with reference being made to the relevant accompanying drawings.

Figure 1:
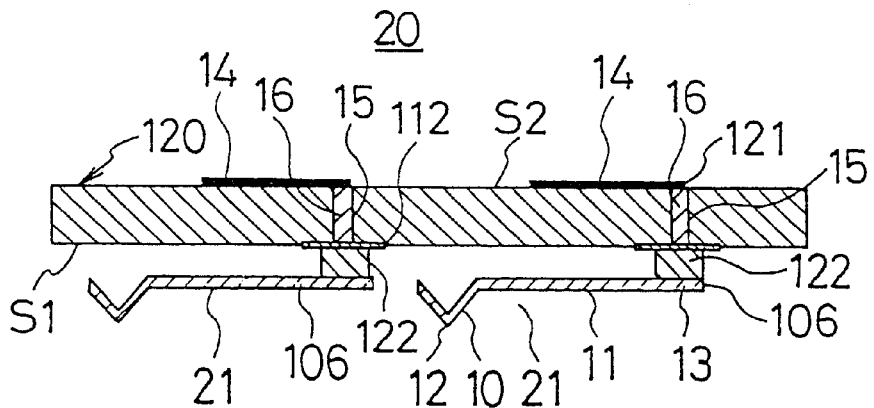
FIG. 1 is a cross-sectional view that shows the configuration of an example of a probe card according to the present invention.

Specifically, FIG. 1 is a cross-sectional view that shows the configuration of an example of a probe card according to the present invention.

This drawing shows a probe card 20, in which a main surface S1 of a substrate 120 has a contact terminal 10 of an appropriate shape which has a protrusion 12 on a part thereof, an end 13 of a lead 11 being mounted between the substrate 120 and a probe 21 via an intervening holding part 122, and the lead 11 progressively separating from the main surface S1 along the direction of the main surface 21.

More specifically, the probe card 20 according to the present invention has a group of a plurality of probes 21 having approximately the same shape as one another, these being arranged on the main surface S1 of the substrate 120, on which is formed an appropriate wire 14 included in the probe card, each probe 21 in the group of probes having a lead 11 and an end contact terminal 10 that includes a protrusion 12 that is formed at one end thereof.

The end 13, which is not provided with the above-noted end contact terminal 10, is connected to the main surface S1 of the substrate 120 via a holding section 122, which has prescribed height.

That is, the holding section 122 that is provided on the main surface S1 of substrate 120 can be provided in a quantity that is equal to or exceeds the number of probes 21, these being provided in an arrangement having a prescribed pattern, or these can be provided beforehand on one end of the lead 11 of the probe.

While there is no particular restriction to the height of the holding section 122, it is desirable that the holding section 122 have a height such that each of the probes 21 be separated away from the main surface S1 of the substrate 120 by at least a pre-established distance.

Furthermore, it is desirable that the heights of the holding section 122 be established so as to have a uniform height.

Figure 3:
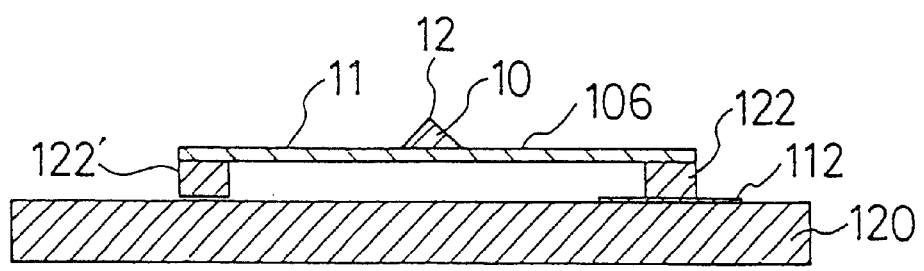
FIG. 3 is a cross-sectional view, which shows the configuration of another example of a probe card according to the present invention.

The probe 21 according to the present invention can support the contact terminal 10 in cantilever fashion, as shown in FIG. 1, via the holding section 122, and can also, as shown in FIG. 3, be itself supported by holding sections 122 at both ends thereof, in what could be called a double-end support arrangement.

In the case of double-ended support, at least on holding section 122 must be fixed to the main surface S1 of the substrate 120, and it is not necessary that the other holding section 122' be fixed to the main surface S1 of the substrate 120.

It is desirable that each of the probes 21 of the probe card 20 according to the present invention, as shown in FIG. 1 and FIG. 3, be mounted to the holding section 122 of the substrate 120 so that the lead 11 is approximately parallel to the main surface S1 of the substrate 120.

Because each of the probes 21 of the probe card 20 of the present invention adopts the above-described configuration, it is possible for the end contact terminals 10, which have the protrusions 12, to make contact with an electrode or contact terminal 25 that is provided on a main surface S3 of an electronic component 111 provided for the inspection of the electronic component 111, this contact being made with an appropriate amount of force with respect to the electrode or contact terminal 25.

Additionally, in a probe card according to the present invention, because the lead 11 has flexibility, the contact terminal 10 with the protrusion 12 is capable of arbitrarily moving up and down at the position of contact with the electrode or contact terminal 25.

Therefore, even if the surface arrangement positions of the plurality of electrodes or contact terminals of the electronic component under inspection vary, or if the surface becomes deformed, at each of these probes the contact terminal is capable via the lead 11 of free adjustment, so that the contact terminals 10 can make reliable contact with the plurality of electrodes or contact terminals of the component under inspection, with an appropriate and approximately equal pressing force, the result being a great improvement in the efficiency of the inspection, without the occurrence of faulty inspection.

Figure 2:
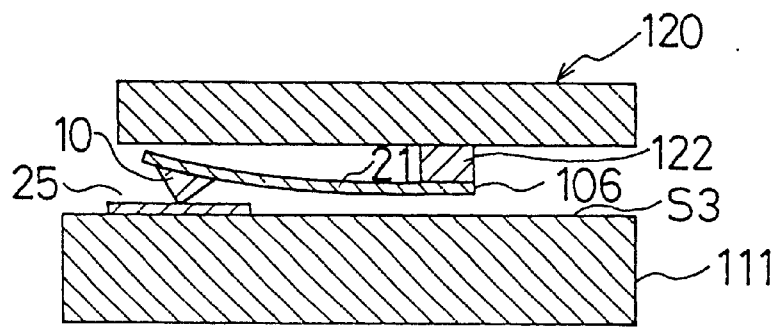
FIG. 2 is a cross-sectional view which illustrates the shape observed when a probe card according to the-present invention makes contact with an electrode or a contact terminal of an electronic component under inspection.

It is desirable that the lead 11 and the contact terminal 10 of the probe 21 of the present invention be formed as one, and also preferable that the end contact terminal 10, as shown in FIG. 1, have a V or U shape, or a spherical shape, the upper part of which is open, and the inner part of which is a void, and it is also possible that the above-noted internal void be filled, as shown in FIG. 2, by an appropriate resin or metal.

It is desirable that the protrusion or extension 12 that is used on the contact terminal 10 of the probe 21 used in the probe card according to the present invention either have a cross-section as viewed from the side that is V-shaped, U-shaped, or be spherical in shape, and it is also desirable that the contact terminal 10 that is provided on part of the lead 11 have one shape that is selected from a group of shapes consisting of a pyramid, including the shapes of a triangular and a quadrangular pyramid, a cone, and a hemisphere.

Additionally, in the present invention the protrusion 12 of the above-noted end contact terminal 10 must be formed so as to extend in a direction that is opposite to the direction of the main surface S1 of the substrate 120.

Figure 4:
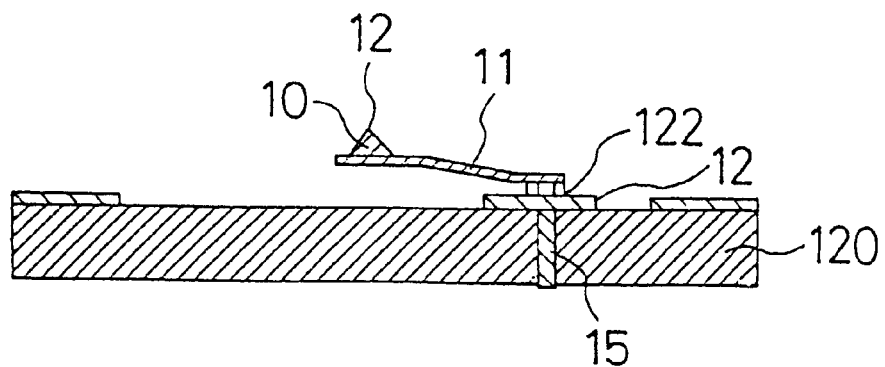
FIG. 4 is a cross-sectional view, which shows the configuration of yet another example of a probe card according to the present invention.

In another specific example of a probe card according to the present invention, which is shown in FIG. 4, the lead 11 of each of the probes 21 is configured so that the spacing between the lead 11 and the main surface S1 of the substrate 120 increases with increasing distance from the end 13 of the lead 11, which is connected to holding section 122.

Figure 5:
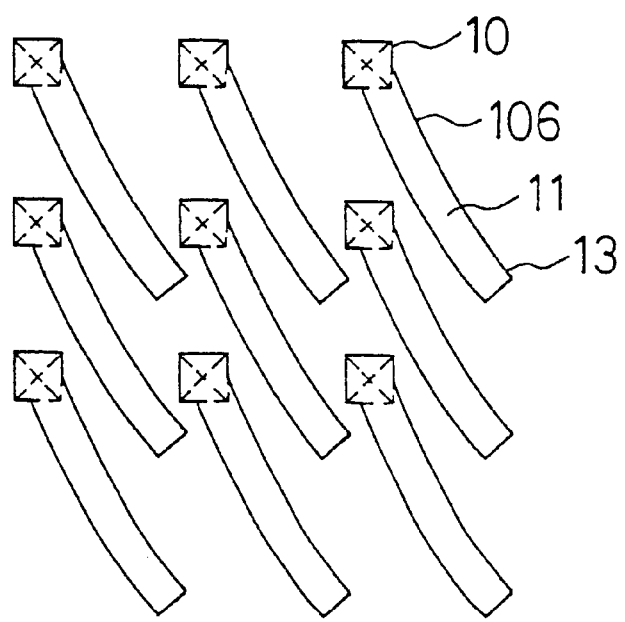
FIG. 5 is a plan view that shows an example of the arrangement condition of a probe card having a lead section with the end contact terminals used in the present invention.

The probes 21 which make up the probe card 20 according to the present invention are formed in a pattern such as shown in FIG. 5, the plurality of probes 21 being mounted to the main surface S1 of the substrate 120 of the probe card 20 in an arrangement such as the condition shown in FIG. 1.

That is, in a probe card 20 according to the present invention, there are for example a plurality of holding sections 122 provided on the main surface S1 of the substrate 120, each of these holding sections 122 having an end 13 of one of a plurality of leads 11 in contact with it so that, as shown in FIG. 5, each of the leads 11 has approximately the same shape as the others, and at least one part of each can be arranged regularly in one and the same direction.

Additionally, a holding section 122 can be formed one end of each of the leads 11 beforehand, this holding section 122 being then joined to the main surface S1 of the substrate 120.

There is no restriction to the number of probes 21 provided on the probe card 20 according to the present invention, nor to their density and their arrangement or the like, and it is possible to establish these probes arbitrarily, in accordance with the electrodes or terminals of the electronic component to be inspected.

The method of manufacturing a probe card according to the present invention will be described below, this method basically applying such techniques as sputtering, etching, and photolithography, enabling the simple and efficient design and manufacturing of a probe card 20 such as described above.

There is also no restriction with regard to the configuration of the probe 21 in the above-noted present invention, and the protrusion or extension 12 of the end contact terminal 10 of the above-noted probes 21 can be formed so as to have at least a conductive film formed thereon in a curved shape, and can also have a laminate of a plurality of films having mutually different electrical characteristics and physical characteristics.

The lead 11 of the probe 21 preferably is configured as a laminate of at least two films having mutually different electrical characteristics and physical characteristics, and it is desirable that the lead 11 and the contact terminal 10 be formed together as one.

More specifically, it is desirable that, of the film structures of minimally two layers that make up the end contact terminal 10 and the lead 11, contact terminal 10 have a first layer that makes up the surface that makes direct contact with the object under inspection, this first layer being made of rhodium or platinum, and a second layer, which is joined to the first layer, this second layer being made of nickel.

It is further preferable that at least the part of the lead 11 in the probe 21 of the present invention that is connected to the holding part 122 at the end 13 has a third layer added to the first layer and the second layer. In the above-noted configuration, it is preferable to use gold as the third layer.

Additionally, it is desirable that the substrate 120 of the probe card 20 according to the present invention be a printed circuit board, with at least a main surface of the substrate 120 and preferably the main surface S2 which is opposite to the main surface S1 on which the probe group 21 is disposed having formed on it a wire 14 which is electrically connected to the lead 11, via an appropriate via hole 15, which is filled with an electrically conductive material 16.

A specific example of a method of manufacturing a probe card 20 according to the present invention will be described below, with reference being made to relevant accompanying drawings.

First, as the first step in manufacturing a probe card 20 according to the present invention, a die material for the forming of a protrusion 12 which makes up the end contact terminal 10 of the probe 21 is formed is fabricated.

Figure 6:
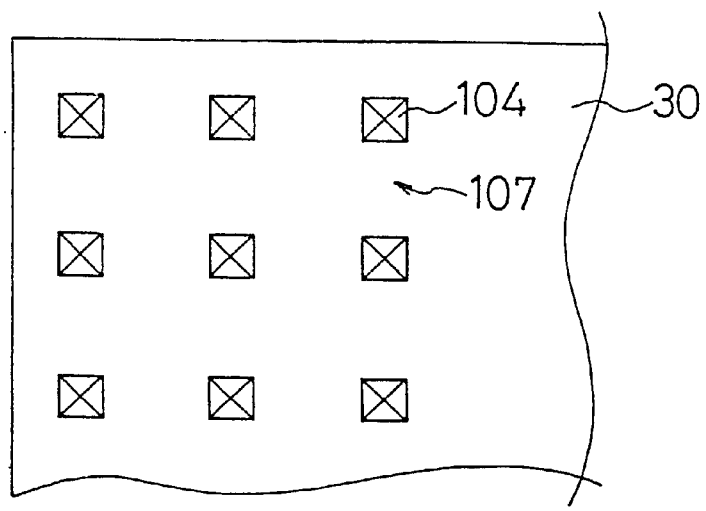
FIG. 6 is a plan view that shows an example of the end contact terminals formed by an arrangement of a plurality of etched pits for the purpose of forming the end contact terminals.

Specifically, FIG. 6 shows an example of the formation of an end contact terminal forming die 107 for the purpose of forming the end contact terminal 10 of the probe 21, which has an arbitrary shape, using a silicon wafer.

FIG. 6 shows an example of a die 104 for the case in which the shape of the end contact terminal 10 of the probe 21 is a quadrangular pyramid, the arrangement spacing, size, and arrangement shape of the die 104, as discussed above, being establishable in accordance with the arrangement shape of the electrodes or terminals of the electronic component under inspection.

Figure 8:
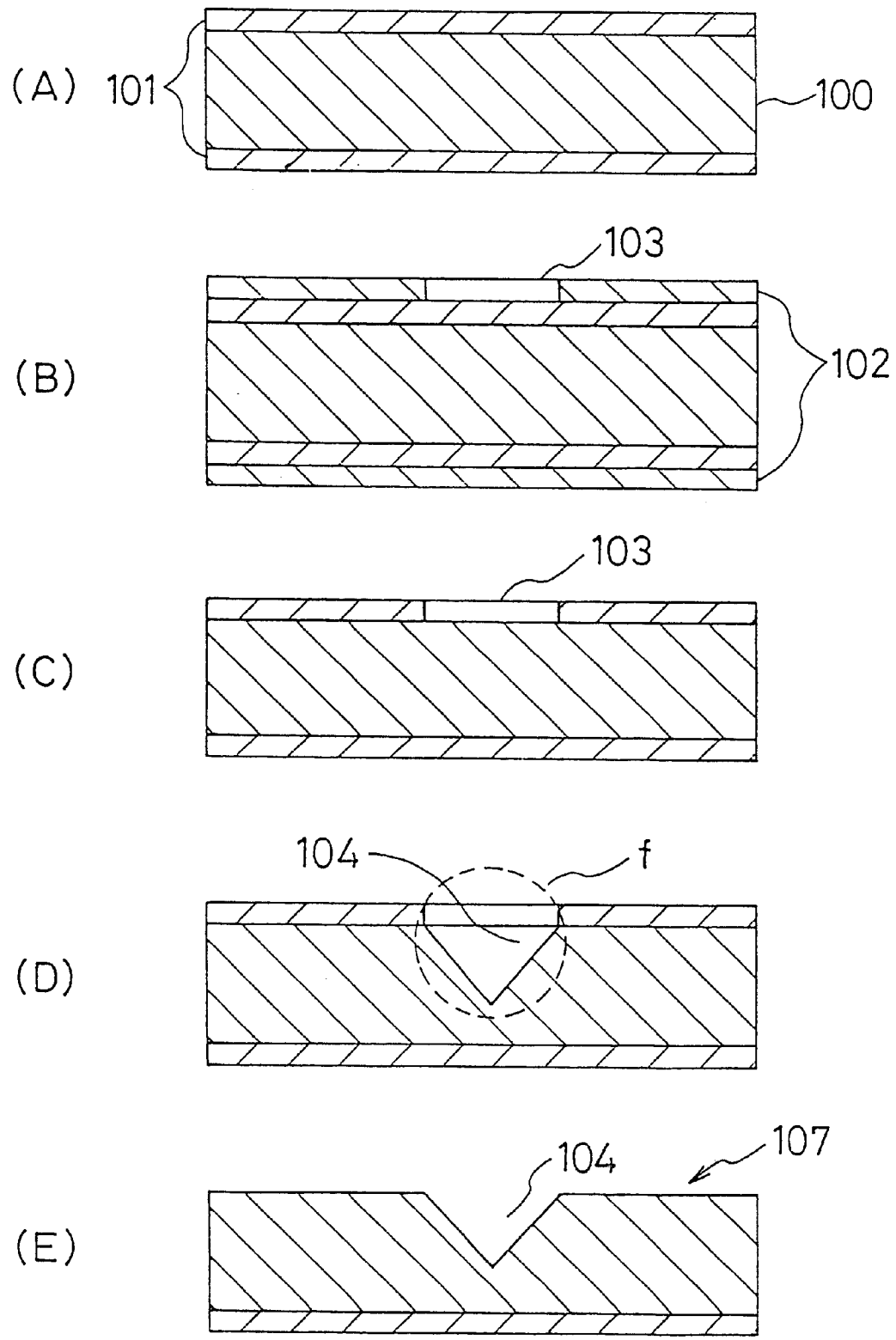
FIG. 8(A) through FIG. 8(E) are cross-sectional views which illustrate an example of a method of manufacturing a die substrate for forming the end contact terminals to be used in the present invention.

FIG. 8 shows the manufacturing process steps for forming the above-noted end contact tip forming die 107. These drawings show only one end contact terminal.

As shown in FIG. 8(A), a 6-inch-diameter silicon wafer substrate 100 having a thickness of 1 mm and having a (100) crystal plane is prepared, a thermal oxide film 101 being formed on both sides thereof, to a thickness of 1 $\mu$m.

Next, as shown in FIG. 8(B), photoresist 102 is coated to a thickness of 5 $\mu$m. This is exposed through a prescribed mask and developed, thereby forming an aperture 103 in the photoresist 102.

The aperture 103 is formed at a location that corresponds to the position of an IC electrode that transfers an end contact terminal, and the side of the aperture 103 is either parallel to or perpendicular to the <100> plane.

As shown in FIG. 8(C) this silicon wafer 100 is subjected to hydrofluoric acid, thereby removing the thermal oxide film at the aperture 103 of the photoresist 102, a solvent being used to peel off the photoresist 102.

Then, as shown in FIG. 8(D), a 10% solution of potassium hydroxide is used to perform anisotropic etching of the silicon wafer 100, thereby forming a depression (etch pit) that has a (111) plane.

Details of the f part of FIG. 8(D) are shown in FIG. 9(A) and FIG. 9(B).

As shown in FIG. 9(A) and FIG. 9(B), at the point at which the etching is completed, the thermal oxide film 101 is shaped so that there is protrusion toward the middle of the etch pit 104 and, because this part is the cause of catching in a subsequent transfer process, buffered hydrofluoric acid processing is done to completely remove the thermal oxide film of the surface that has the etch pit, as shown in FIG. 8(E).

The thermal oxide film 101 is left on the reverse side of the substrate 100 as an insulator. For this reason, it is not necessary to mask the reverse surface during the subsequent plating step.

The above process steps complete the fabrication of the end contact terminal forming die 107.

Next, using the above-noted end contact terminal forming die 107, the end contact terminal 10, which has a protrusion, and the lead 11 which is connected thereto are formed as described below.

Figure 10:
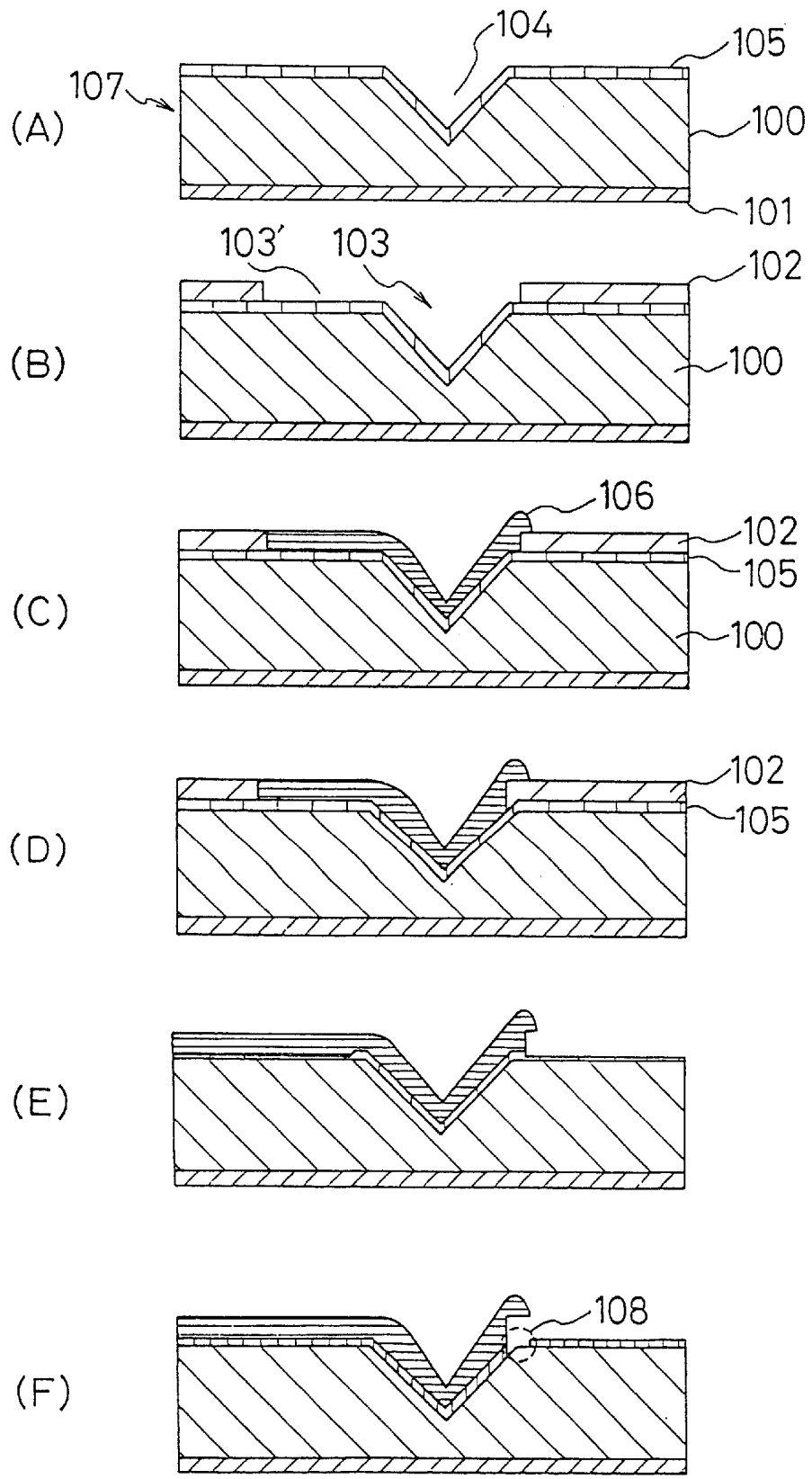
FIGS. 10(A)–10(F) are cross-sectional views which show examples of a method of manufacturing a probe in which the end contact terminal is formed from the lead section.

As shown in FIG. 10(A), a sputtered copper film 105 is applied to the end contact terminal forming die 107 to a thickness of 1 $\mu$m. Then, as shown in FIG. 10(B), the photoresist 102 is applied to a thickness of 15 $\mu$m, this photoresist 102 being exposed in a prescribed pattern, so as to provide an aperture 103, and a forming section 103' of the lead 11.

When doing this, as shown in FIG. 11(A), the edge part 32 of the aperture 103 is made smaller than the corner 31 of the etch pit 104 by, for example, 5 $\mu$m.

To this, electroplating is done, for example, of rhodium to 1 $\mu$m, nickel to 10 $\mu$m, and gold to 5$\mu$m, these layers being laminated in this sequence, thereby forming a plating film 106 that forms the end contact terminal 10 and the lead 11.

In the present invention, use of the above-noted rhodium layer as the first layer which directly contacts the electrode or contact terminal of the electronic component under inspection is because of its electrical conductivity and high film strain, insofar as it provides an advantageous in the peeling transfer process step to be described later. However, there are cases in which platinum can be used.

FIG. 10(C) shows a cross-section view as seen in the direction of the broken line c in FIG. 11(A), and FIG. 10(D) shows a cross-section view in the direction of the broken line d in FIG. 11(B).

Specifically, when forming the plating film 106 in the present invention the photoresist 102 is caused to remain on at least one corner 31 part of the etch pit 104, so that the plated metal film described above is not formed on this part, thereby creating a structure which encourages peeling of the plated metal film 106 from the silicon die 104.

As shown in FIG. 10(E) and FIG. 10(F), after peeling the photoresist 102, immersion is done in a solution of 5% sulfuric acid and 5% hydrogen peroxide for 20 seconds, thereby etching the sputtered copper film 105 0.5 $\mu$m, this being then washed with pure water.

FIG. 10(E) and FIG. 10(F) show the cross-sectional views after etching, with FIG. 10(F) showing the cross-section after etching the structure of FIG. 10(D).

Figure 12:
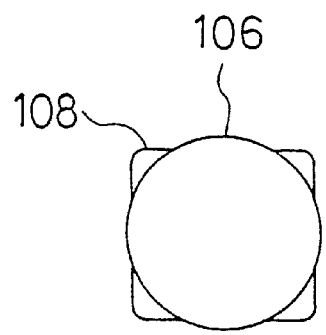
FIG. 12 is a plan view that shows the plating film shape at the end contact terminal of the present invention.

As shown in FIG. 12, the sputtered copper film 105 is partially etched to expose part 108 of the underlying base of the silicon wafer 100. When doing this, because the corner part of the plated film 106 is missing, the etching of the part shown as 108 in FIG. 10(F) is easily facilitated.

Furthermore, the boundary between the etch pit and the silicon wafer surface is convex, so that the etching speed is greater than if it were flat.

Although the metal of the plated film 106 that forms the end contact terminal 10 will dissolve, depending upon the material, such as nickel, the amount dissolving is only approximately 2 $\mu$m, and is therefore not a problem.

By doing this, when transferring the end contact terminals 11 and lead 10 in a subsequent processing step, peeling of the plating film 106 from the etch pit 104 of the end contact terminal forming die 107 is facilitated.

In the present invention, because the thermal oxide film 101 on the silicon substrate 100 is removed, the part having a shape that presents an impediment to peeling is removed, thereby facilitating peeling.

Next, the method of transferring the end contact terminal 10 that is formed by the end contact terminal forming die 107 and the lead 11 to the substrate 120 that forms the probe card will be described.

Figure 7:
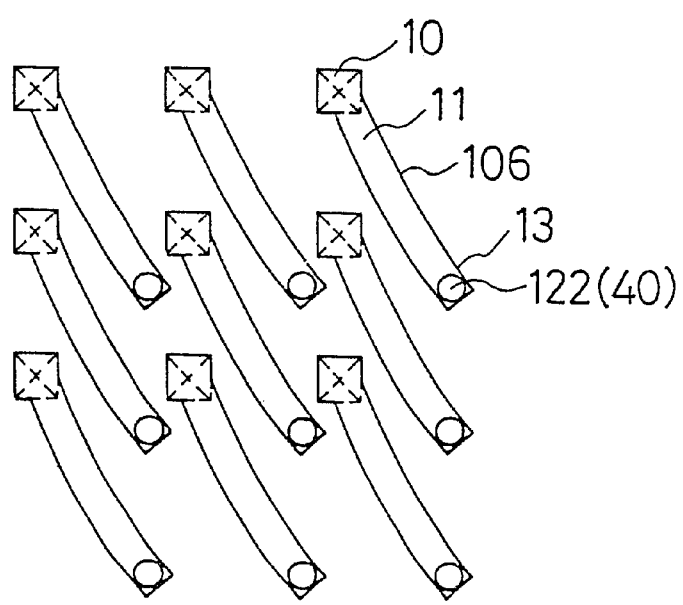
FIG. 7 is a plan view that shows an example of the case in which a holding section is formed on the end of the lead section, in the probe arrangement shown in FIG. 5.

Specifically, as shown in 13, a plurality of probes 21 having a shape and arrangement pattern such as shown in FIG. 7 are formed on the end contact terminal die substrate 107 so as to have an end contact terminal 10 and a lead 11. This plurality of probes 21 has etch pits that are arranged with a spacing of, for example, 150 $\mu$m. That is, this pattern is disposed in an area measuring 10 mm by 10 mm, enabling the location of an overall count of 1600 etch pits 104 within this area.

The end contact terminal forming die 107, as noted above, has a sputtered copper film 105 having a thickness of 1 $\mu$m, onto which photoresist is applied, this photoresist 102 being exposed with a prescribed pattern mask and developed, thereby forming the aperture 103 as shown in FIG. 5.

The aperture 103 covers at least two corner parts 31 of the etch pit 104.

Over this aperture are electroplated rhodium to a thickness of 1 $\mu$m, nickel to a thickness of 5 $\mu$m, and rhodium to a thickness of 1 $\mu$m, thereby forming a plated film 106 having a bump.

Then, after washing the photoresist 102, photoresist is again applied, and the aperture 40 is formed in the part shown in FIG. 7, that is on one end 13 of the lead 11.

Gold plating is done onto the aperture 40 to form a connection bump 122, after which this photoresist is washed to remove it.

Figure 13:
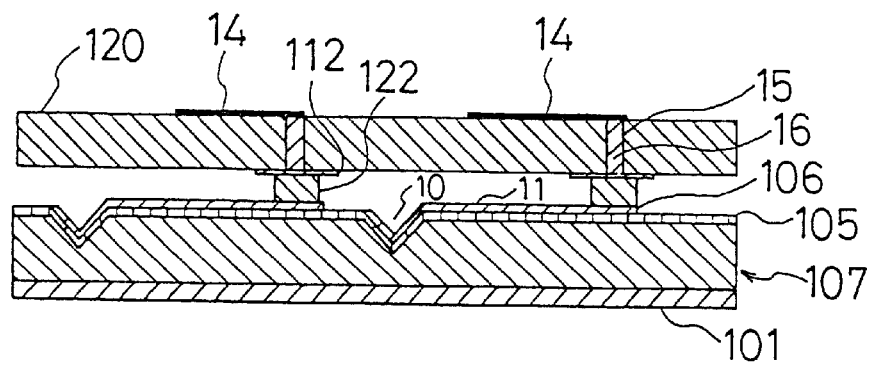
FIG. 13 is a cross-sectional view that illustrates the step of forming a probe card according to the present invention.

Next, referring to FIG. 13, appropriate electrodes 112 are disposed on the main surface S1 at positions that correspond to the ends 13 of the leads 11 that are disposed in a pattern such as shown by example in FIG. 5.

These electrodes 112 have provided a separate substrate 120, which is electrically connected, via the electrically conductive material 16 that fills the inside of the via hole 15 that passes through the substrate 120, with the wire 14 provided on either one main surface or the main surface 12 on the opposite side from main surface S1 on which is provided a group of probes 21, a mutual positioning and joining being made between this substrate 120, the holding part 122 on which are formed the ends 13 of the leads 11 for each of the probes, and the electrodes 112, the connection holding part 122 being connected to the electrodes 112 of the substrate by, for example, the application of heat and pressure.

Then, when the probe forming die 107 and substrate 120 are moved in a direction that causes mutual peeling away, the plating film 106 is transferred to the substrate 120, thereby resulting in the probe card 20 as shown in FIG. 1.

When using the probe card 20 according to the present invention, as shown in FIG. 2, the IC under inspection 111 and probe card 20 are mounted in a test apparatus and prescribed electrodes are positioned with respect to the end contact terminals 10 of the probes of the probe card, and a prescribed pressure is applied so as to obtain an electrical connection between the two.

In the present invention as illustrated, there is a dip in the plating film 106 of the amount of the height-of the holding part 122 that is formed on the plating film 106, thereby enabling a stable connection by absorbing differences in the heights of electrodes or connection terminals.

In this case, it is possible to employ a ceramic wiring board of the type generally used as the substrate 120. Because a ceramic substrate has good rigidity and even a lapped board measuring 100 by 100 mm exhibits warping of only approximately 5 $\mu$m, by performing repeated transfers of the plating film 106, it is easily possible to fabricate a probe card of this size.

As shown in FIG. 13, the plating film 106 is positioned with respect to the substrate 120, heated to 350 degrees, with pressure being applied thereto at approximately 20 g at the holding part 122, so that the plating film 106 is transferred to the electrodes 112.

Then, the end contact terminal forming die 107, as shown in FIG. 1, is peeled away, thereby completing the fabrication on the substrate 120 of the probe 21, which is formed by a lead 11, which has an end contact terminal 105.

In performing the above-noted transfer operation, because there is a missing part at the corner of the end contact terminal 10, when peeling is applied after pressure-application to the electrode, a stress concentration occurs at this part, so that peeling occurs easily at the boundary between the sputtered film 105 and the silicon wafer.

As shown in FIG. 10(F), by removing the copper film by etching, it is possible to further aid the peeling between the sputtered film and the silicon wafer.

For this reason, it is possible to inhibit the occurrence of the problem of non-transfer when performing transfer of the end contact terminals.

After transfer, the sputtered copper film 105 on the surface of the end contact terminals 10 and the above-noted etch pits 104 of the probe forming die substrate 107 are etched for 60 seconds in a 5% solution of hydrogen peroxide and washed for removal.

Figure 9:
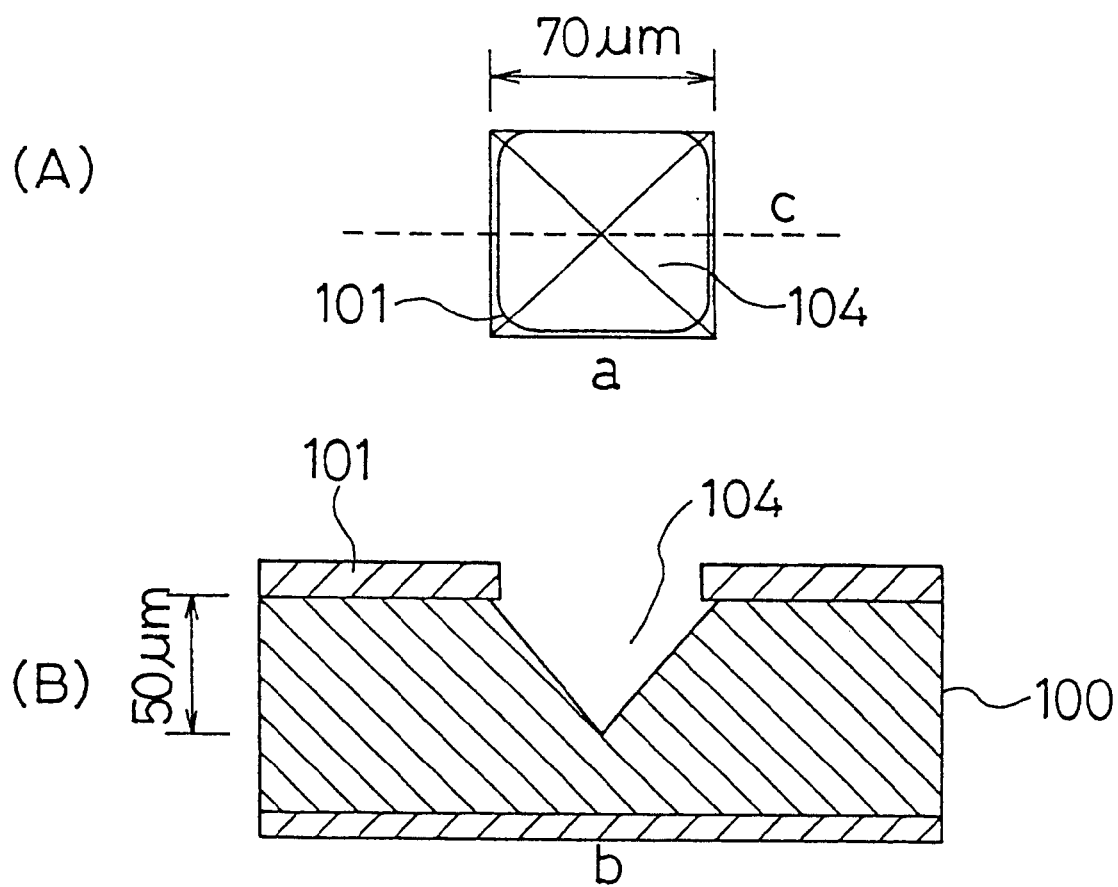
FIG. 9(A) and FIG. 9(B) are drawings which show the details of the shape of the etched pits in the present invention.

By way of comparison, a comparative study was done by comparing the peeling effect of a probe during the transfer operation according to the present invention with the peeling effect of a probe 21 that has an end contact terminal 10 that is fabricated by the prior art method, in which a plating film 106 is continuously formed without breaks around the etch pit 104, in contrast to the present invention as shown in FIG. 9.

In the end contact terminal 10 according to the prior art, even with etching of the copper sputtered film, because the corner part 31, as shown in FIG. 10(C), is covered with the plating film 106, etching is only possible from the end.

For this reason, the progress of the etching is slow, and if the sputtered copper film 105 is etched for a long period of time, because approximately 10 μm of etching is done, the etching depth is affected by the etching conditions, and by variations in the pattern accuracy, plating film thickness, and film stress.

That is, in the method of the past, because there differences in the etching speed between each end contact terminal 10, at terminals for which the etching speed is high the copper will be largely etched away, these being peeled from the die and removed when washing before transfer.

There is also the problem of from 10 μm to 20 μm of nickel or the like of the plating film 106 which forms the end contact terminals 10 being removed.

In view of the above-noted problem, a peeling transfer experiment was done with regard to the end contact terminal 10 of the probe 21 obtained by the method of the present invention and the probe 21 formed by the method of the past.

The arrangement of the end contact terminals 10 for the above-noted experiment was one in which a total of 32,000 end contact terminals were provided on a 6-inch wafer, arranged in rectangular arrangement.

The results for the case of performing transfer by applying a pressure of 20 g per aluminum end contact terminal of a wafer onto which are formed ICs and heating for 10 seconds to 350° C. are as follows.

| Etching time (s) | Number good | Number of end contact terminals that fall off | Number of end contact terminals remaining on the forming die |
| --- | --- | --- | --- |
| 10 | 5 | 0 | 95 |
| 100 | 3 | 38 | 59 |
| 200 | 0 | 98 | 2 |

What this demonstrates is that, with a structure in which the corner 31 of the end contact terminal 31 is not broken, there is no improvement in the rate of transfer, because the peeling of the end contact terminal 10 does not progress. On the other hand, the following table indicates the number of end contact terminals that had been fallen off before the transfer versus the number of end contact terminals that are actually remained inside the molding for the end terminal contact, by changing the etching time of cupper before the transfer so as to improve the rate of transfer in the case in which the corner part 31 is not notched.

The causes of failures of the end contact terminal (in terms of number of ICs) using a structure in which the corner part is not notched are as follows.

|  | (No. of good end contact terminals)/ (total number) |
| --- | --- |
| Structure in which the corner of the end contact terminal is notched | 100/100 |
| Structure in which the corner of the end contact terminal is not notched | 5/100 |

Judging from the above results, when the etching time for the sputtered film 105 is short, because the strength of the intimate contact between the wafer and the plating film is large, the transfer rate is low, and when the etching time is long, the plating film 106 comes off of the substrate in process steps before transfer.

The silicon wafer which was used in forming the end contact terminals was placed in an etching solution of sulfuric acid and hydrogen peroxide so as to remove all of the copper, and was used again.

Because dirt and the like which becomes attached during processing also comes off of the substrate when the copper is dissolved, it is possible to use this any number of times without problems caused by attached dirt.

In contrast to the present invention, in the case of the structure of Japanese Unexamined Patent Publication (KOKAI) No. H1-98238, in the case in which a platinum film is damaged, because there is no method of peeling away the platinum film, it is necessary to discard the die.

In another specific example of the present invention, the second photoresist of FIG. 7 is applied and an aperture is formed, after which solder plating can be done instead of gold plating.

In this example, in the case in which there are a number of broken plating films, it is possible to repair them one at a time. By heating a broken plating film and removing it, and soldering a plating film made by a die of only a single plating film in a prescribed position, it is possible to repair a probe card.

Additionally, in yet another example of the present invention solder plating is used, as in the above-noted example, to fabricate a probe card, with a plating film 106 being transferred to a printed circuit board having a thickness of 2 mm. For a board up to 20 by 20 mm, warp and the like in the board can be absorbed by the resiliency of the probes, enabling the fabrication of a low-cost probe card.

In yet another form of a method of manufacturing a probe card according to the present invention, an end contact terminal forming die 107 and arrangement pattern such as shown in FIG. 5 and FIG. 6 are used to form the end contact terminals 10 and leads 11 of the probe 21, and a holding part 122 that has a prescribed height and size is formed on an electrode 112 provided on the main surface S1 of the probe card substrate 120, one end 13 of the lead 11 of the probe 21 being joined to this holding part 122.

By using the above-noted example, the stroke of the probe, which is connected to the holding part 122, can be made larger by the amount of the height of the holding part 122, for example, 20 μm higher.

In yet another example of the present invention, as shown in FIG. 3, a protrusion, that is, the holding part 122, is formed onto both ends of the plating film 106 for the purpose of connection, the protrusion on one end only of the holding part 122 being connected to the electrode 112 of the substrate 120, the other end of the holding part 122 remaining as a free end.

By doing this, the structure is one in which the load is supported at both ends, this enabling the formation of a connection part that has more springiness than the embodiment 10.

In another specific example of a probe card according to the present invention, for example, the spacing between the lead 11 and the main surface S1 of the substrate 120 increases with increasing distance from the one end 13 of the lead 11 that is connected to the holding part 122.

Figure 14:
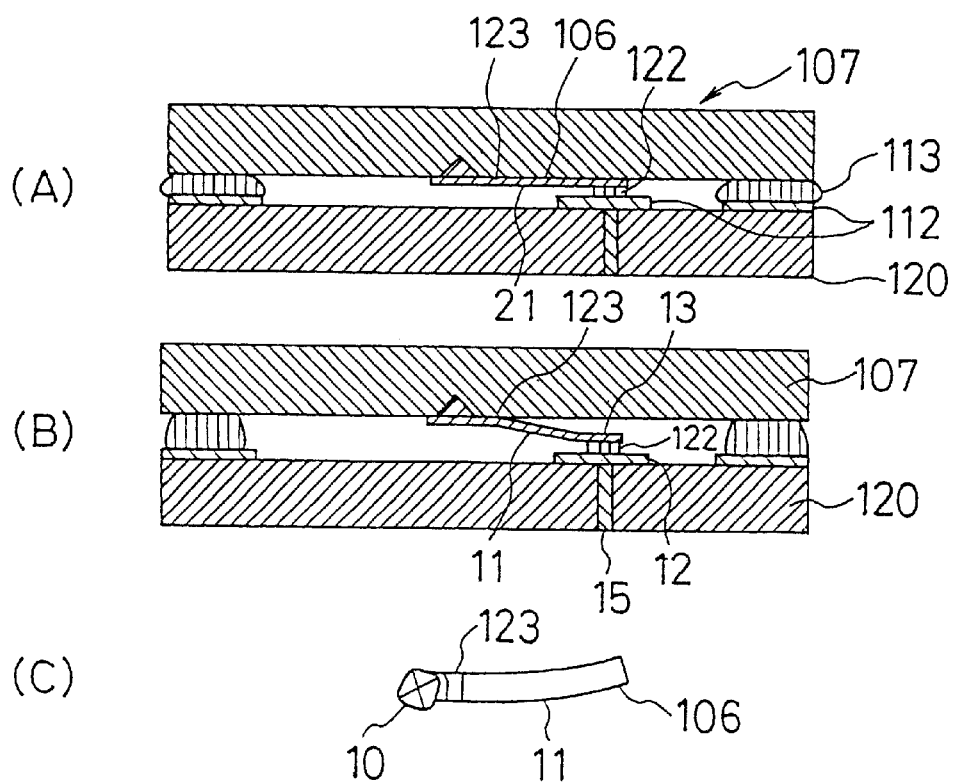
FIG. 14(A) and FIG. 14(B) are cross-sectional views which show another example of a method of forming a probe card according to the present invention.

An example of manufacturing the above-noted probe card 20 is shown in FIG. 14, and described below, in which case an end contact terminal forming die 107 is fabricated, as in the above-noted specific examples of the present invention.

Specifically, titanium and palladium are sputtered onto the etch pitch surface 104 to thicknesses of 0.05 μm and 0.1 μm.

Then, photolithography is used to form a gold plating of 1 μm onto the plating holding part 123, as shown in FIG. 14(C).

This end contact terminal forming die 107 is ion-beam etched to remove the metal film in parts other than the parts with the gold plating. In this manner, a bump forming die 107 of this example is formed.

Next, a sputtered copper film 105 is applied to the above-noted end contact terminal forming die 107, photoresist is applied thereto, and films of rhodium (1 μm), palladium (10 μm), and gold (1 μm) are laminated thereonto in this sequence, thereby forming the metal film 106.

Along with the above-noted structure, a probe card substrate 120 of, for example, ceramic, and having a structure the same as shown in FIG. 13, is prepared.

On this substrate 120 are provided electrodes 112 at positions which are opposite the end parts 13 of the leads 11 of the probes 21, solder of thickness 100 μm being fed thereto.

The above-noted forming die 107 is heated at 350°, pressure of 50 g per connection is applied to cause transfer of the plating film to the substrate 120. When this is done, after maintaining the heated condition of the connection part for 30 seconds after the above process step, 30 μm of the connection part is peeled away from the substrate 120.

When doing this, because of the strength of the intimate contact between the silicon wafer 100, the sputtered copper film 105, and the plating film 106, the plating film 106 on the plating film holding part 123 does not peel away from the bump forming die 107, the plating film 106 exhibiting plastic deformation, as shown in FIG. 14(B).

The plating film 106, which has undergone a plastic deformation, is allowed to cool to room temperature in this condition, and is held in this condition.

The plating film 106 was the above-noted condition is immersed in a copper-etching fluid for 10 minutes, to completely dissolve away the sputtered copper film of the plating film holding part. Then the solder was melted and the printed circuit board and bump forming die were peeled apart.

As a result, a probe card was fabricated which has a lead 11 of the probe 21 made from the plating film 106 that is deformed as shown in FIG. 4.

That is, in this example of the present invention the stroke of the end contact terminal 10 is increased by just the amount of the deformation of the plating film 106.

Then the solder that remains on the wafer is removed by suction, immersion is done into a copper-etching fluid to remove solder and the sputtered film remaining on the bump forming die, followed by cleaning and drying before re-use for the purpose of probe fabrication.

In the above-noted example of the present invention, as indicated in the drawing, because the end contact terminal 10 that is formed on one end of the lead 11 that forms the probe 21 has a structure in which the inside thereof is filled with a prescribed metal, and in which the one end of the lead 11 is connected and fixed to the surface of the end contact terminal 10, as described above the end contact terminal 10 can either have an open part or have a hollow part within it.

The present invention as described above is a method of efficiently manufacturing a probe card 20, using a transfer method, this probe card having a plurality of probe groups 21 with a prescribed shape and a prescribed arrangement density.

One feature thereof is that the corner part 31 of a contact terminal 10 that is provided on a lead 11 is provided with a cutaway part.

One example of a method of manufacturer thereof, as is clear from the foregoing description, a step of forming, onto a lead forming die substrate that is made from a die for the purpose of forming a contact terminal that is provided for a lead, a thin-film of a prescribed shape, using the material that makes up the lead, a step of preparing a substrate which has prescribed wiring that makes up the probe card, a step of forming a holding part onto one end of a lead forming die substrate at which a thin-film end terminal for forming a lead is not located, a step of joining the holding part to together with the substrate, and a step of peeling the substrate from the lead forming die substrate, and causing a lead forming die thin-film layer, which includes a contact terminal that is formed on the lead forming die substrate, to be transferred onto the substrate.

Figure 15:
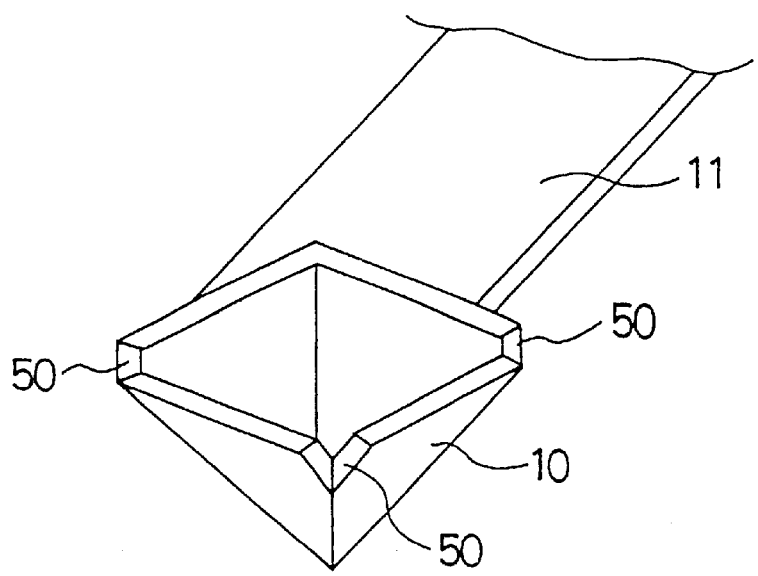
FIG. 15 is a perspective view that shows an example of the configuration of a probe used in the present invention.
Figure 16:
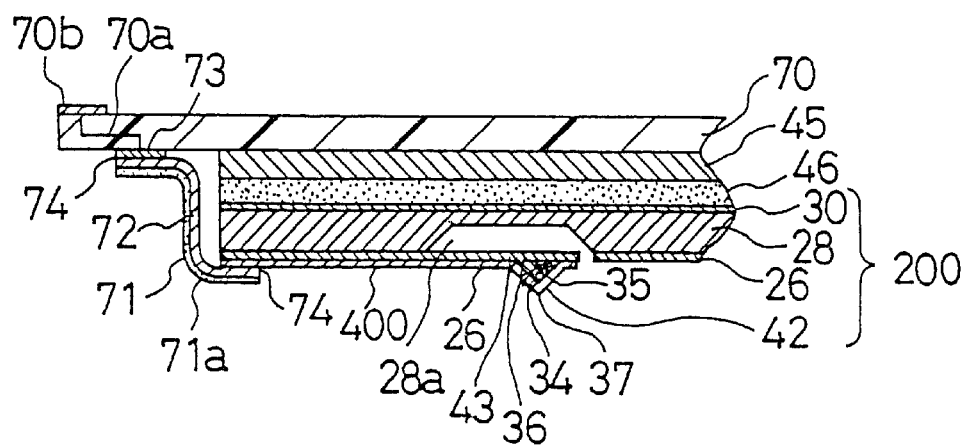
FIG. 16 is a cross-sectional view that illustrates an example of a probe card of the prior art.
Figure 17:
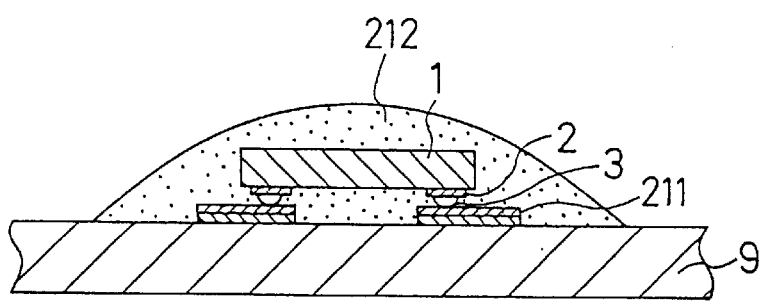
FIG. 17 is a cross-sectional view that illustrates an example of a probe card of the prior art.
Figure 18:
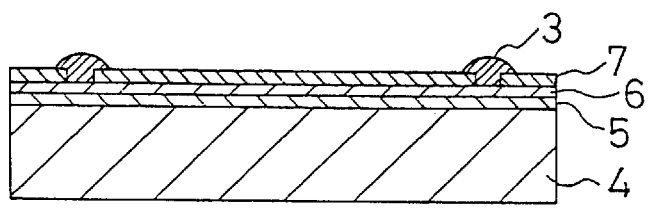
FIG. 18 is a cross-sectional view that illustrates an example of a probe card of the prior art.

Furthermore, in the method of manufacturing the above-noted probe card according to the present invention, as shown in FIG. 15, it is desirable that a cutout part 50 be formed in a part of the contact terminal 10 that is provided on the lead and, more specifically, that this cutout part 50 be formed by covering the corner part 31 of the etching pit part 104 of the substrate 107 which forms the contact terminal, so that an electrically conductive film is not formed on this part.

In the method of manufacturing a probe card according to the present invention, as shown in FIG. 14, in the step of peeling back the substrate from the lead forming die substrate to cause transfer of the lead forming thin-film layer, including the contact terminal, onto the substrate, it is also possible to impart a plastic deformation to the lead forming thin-film layer.

As described in detail above, a probe card according to the present invention is formed, for example, by fabricating a cantilever support with an end contact terminal, and by attaching this to a substrate electrode.

In the present invention, for example, a sputtered film is applied to the etch pit of a silicon substrate, over which patterning is done, an end contact terminal being formed by plating.

When this is done, part of the resist pattern is formed so as to cover the corner part, for example, of the etch pit, so that when plating is done the opening in this resist is larger than the etch pit. Then the resist is removed and the sputtered film is etched, after which hot-pressing or solder is used to transfer the end contact terminal to the probe card substrate.

Thus, in the present invention, by using a silicon etch pit as a die it is possible to form the end contact terminal with good accuracy and with a sharp vertex. Furthermore, by sputtering copper onto silicon, it is possible at a subsequent process step to peel off the end contact terminal 10.

Figure 11:
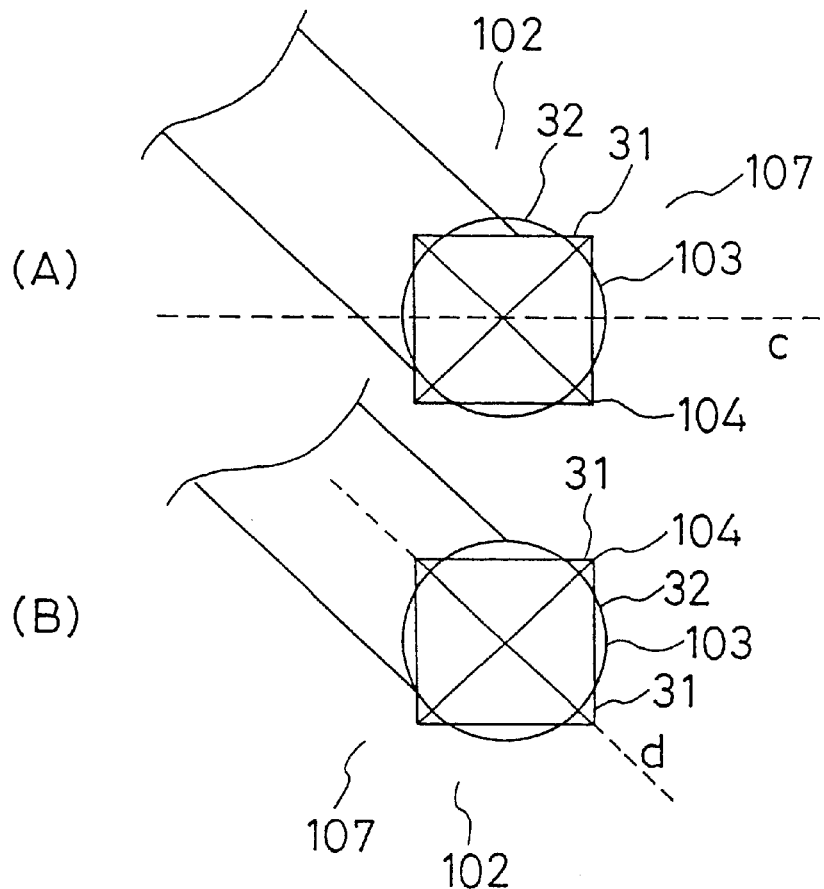
FIGS. 11(A) and 11(B) are plan views of the etched pit and photoresist aperture in the present invention.

In the present invention, by-making the pattern of photoresist for the purpose of forming a plating film that forms the end contact terminal have a shape whereby the corner part 31 of the etch pit 104 is also covered, as shown in FIG. 11, it is easy at a subsequent process step to peel off the end contact terminal 10 by etching the copper.

Additionally, in the present invention, when performing end contact terminal transfer, by performing peeling which includes the sputtered film, and also by dissolving the sputtered film that remains on the end contact terminal forming die, because it is possible to remove the sputtered film, even with repeated use, the die does not easily pick up dirt or become damaged when forming an end contact terminal.

Additionally, in the present invention, because silicon wafer on which is formed the etch pit 104 can be used repeatedly, it is possible to achieve low-cost fabrication of end contact terminals.

In addition, by fabricating a lead with a cantilever structure having an end contact terminal in an arbitrary pattern such as a matrix pattern on the silicon wafer, and then transferring and mounting this onto the electrode of a probe card, it is possible to achieve a low-cost probe card.

The reason for this is that, because the probe is fabricated by transferring a lead made from a plating film onto a wiring board, there is no restriction with regard to the substrate material, it being possible to use an inexpensive substrate, and because the associated process steps are few and simple.

What is claimed is:

1. A probe card comprising:
   a substrate;
   a lead provided on a part of a first main surface of the substrate, one end part of the lead being joined to said substrate via a first holding part; and
   a contact terminal provided on a part of the lead.

2. A probe card according to claim 1, wherein said first holding part is mounted to a rear end part of the lead, the contact terminal being provided on a front end part of the lead.

3. A probe card according to claim 1, further comprising a second holding part, the first and second holding parts connecting said first main surface of said substrate to distal end parts of the lead, the lead being provided with said contact terminal at a middle part of the lead.

4. A probe card according to claim 1, wherein said lead is mounted to said substrate via said holding part so that said lead is nearly parallel to said first main surface of said substrate.

5. A probe card according to claim 1, wherein said lead is configured so that spacing between said lead and said substrate increases with increasing distance from the end of said lead that is connected to said first holding part.

6. A probe card according to claim 1, wherein said contact terminal that is provided on part of said lead is provided with a protruding part that extends in a direction away from said main surface of said substrate.

7. A probe card according to claim 6, wherein said protruding part is formed by at least one conductive film in a bent shape.

8. A probe card according to claim 7, wherein an inside of said contact terminal forms a void.

9. A probe card according to claim 7, wherein an inside surface of said contact terminal is filled.

10. A probe card according to claim 1, wherein an inner part of said contact terminal comprises a void.

11. A probe card according to claim 1, wherein an inner part of said contact terminal is filled.

12. A probe card according to claim 1, wherein said lead comprises a film laminate having at least two layers.

13. A probe card according to claim 12, wherein said film laminate that has at least two layers comprises materials which have mutually different characteristics.

14. A probe card according to claim 13, wherein the at least two layers comprises:
   a first layer defining a surface adapted to make contact with an object under inspection, said first layer comprising one of rhodium and platinum, and
   a second layer which is joined to said first layer comprising nickel.

15. A probe card according to claim 12, wherein at least one end of said lead, at a part that is joined with said holding part, has a third layer in addition to said first and second layers.

16. A probe card according to claim 15, wherein said third layer comprises gold.

17. A probe card according to claim 1, wherein said lead and said contact terminal comprise identical materials.

18. A probe card according to claim 1, wherein said substrate is a printed circuit board, said probe card further comprising a wiring part that is electrically connected from the circuit board to said lead.

19. A probe card according to claim 18, wherein said wiring part is electrically connected to said lead via said holding part.

20. A probe card according to claim 1 comprising a plurality of said leads arranged on the substrate in a regular pattern.

21. The probe card of claim 1, wherein each base corner of the contact terminal is truncated.

22. The probe card of claim 1, wherein the contact terminal is entirely shaped as a polygon pyramid except for the at least one truncated base corner.

23. A method for manufacturing a probe card comprising the steps of:
   providing a lead-supporting substrate having a die part for forming a contact terminal;
   forming a lead having a contact terminal on the lead-supporting substrate by disposing a thin film of a prescribed shape on the lead-supporting substrate;
   providing a probe card substrate having a prescribed wiring part;
   forming a holding section on an edge part of said thin film separated from said contact terminal;
   joining together said holding section and said probe card substrate; and
   moving said probe card substrate away from said lead-supporting substrate, so that the thin film forming the lead is pulled away from contact with said lead-supporting substrate and remains connected to the probe card substrate through the holding section.

24. A method of manufacturing a probe card according to claim 23, wherein said thin film comprises at least two layers of different materials, the different materials having different electrical characteristics.

25. A method of manufacturing a probe card according to claim 24, wherein at least a portion of said thin film comprises separate thin film materials of at least three different types, said thin film materials having different electrical characteristics.

26. A method of manufacturing a probe card according to claim 23, wherein in the step of forming the lead, the thin film is disposed to that, in plan view, a perimeter of said contact terminal lies partly outside and partly inside a perimeter of the die part.

27. A method of manufacturing a probe card according to claim 26, wherein said contact terminal is formed so that at least one part of the perimeter of the contact terminal which lies inside a perimeter of the die part is located at a corner of the die part.

28. The method of claim 27, wherein said contact terminal is formed so that the perimeter of the contact terminal lies inside a perimeter of the die at every corner of the die part.

29. A method of manufacturing a probe card according to claim 23, wherein in the step of moving said probe card substrate away from said lead-supporting substrate, a plastic deformation is imparted to said lead-formation thin film layer.

30. The method of claim 23, wherein the step of joining together the holding section and the probe card substrate is performed so that an air gap exists between the lead and the probe card substrate, allowing the lead to flex from a rest position toward the probe card substrate.

31. A method for manufacturing a probe card comprising the steps of:
   providing a lead-supporting substrate having a die part for forming a contact terminal;
   forming a lead having a contact terminal on the lead-supporting substrate by disposing a thin film of a prescribed shape on the lead-supporting substrate;
   providing a probe card substrate having a prescribed wiring part;
   forming a holding section on said probe card substrate;
   joining together said holding section and one end part of said lead separated from said contact terminal; and
   moving said probe card substrate away from said lead-supporting substrate, so that the thin film forming the lead is pulled away from contact with said lead-supporting substrate and remains connected to the probe card substrate through the holding section.

32. The method of claim 31, wherein the step of joining together the holding section and the lead is performed so that an air gap exists between the lead and the probe card substrate, allowing the lead to flex from a rest position toward the probe card substrate.

* * * * *